(12) United States Patent
Zhu

(10) Patent No.: US 11,404,449 B2
(45) Date of Patent: Aug. 2, 2022

(54) DISPLAY PANEL

(71) Applicant: TCL CHINA STAR OPTOELECTRONICS TECHNOLOGY CO., LTD., Guangdong (CN)

(72) Inventor: Jing Zhu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 126 days.

(21) Appl. No.: 16/979,884

(22) PCT Filed: Jul. 1, 2020

(86) PCT No.: PCT/CN2020/099669
§ 371 (c)(1),
(2) Date: Sep. 11, 2020

(87) PCT Pub. No.: WO2021/203563
PCT Pub. Date: Oct. 14, 2021

(65) Prior Publication Data
US 2021/0320127 A1    Oct. 14, 2021

(51) Int. Cl.
*H01L 27/12* (2006.01)
*G09G 3/20* (2006.01)

(52) U.S. Cl.
CPC .............. *H01L 27/124* (2013.01); *G09G 3/20* (2013.01); *G09G 2300/0408* (2013.01);
(Continued)

(58) Field of Classification Search
CPC ............ G02F 1/136286; G02F 1/1345; G02F 1/13452; G02F 1/13458; G02F 1/136227; G02F 1/133345; G02F 1/133512; G02F 1/1343; G02F 1/13629; G02F 1/136218; H01L 27/124; G09G 3/20; G09G 2300/0408; G09G 2300/0465; G09G 2310/0267; G09G 2320/0252; G09G 2300/0426; G09G 2310/0278; G09G 2320/0223; G09G 3/3266; G09G 3/3674; G09G 3/2022; G09G 2320/0257
See application file for complete search history.

(56) References Cited

U.S. PATENT DOCUMENTS 9,935,131 B2 *  4/2018  Lv .................... H01L 21/76877
2003/0030381 A1  2/2003  Yamazaki et al.
(Continued)

FOREIGN PATENT DOCUMENTS

CN    101482676 A    7/2009
CN    102385200 A    3/2012
(Continued)

*Primary Examiner* — Duc Q Dinh
(74) *Attorney, Agent, or Firm* — The Roy Gross Law Firm, LLC; Roy Gross

(57) ABSTRACT

The present invention provides a display panel, and by means of using a plurality of sub-pixels as a sub-pixel unit, each sub-pixel unit corresponds to one gate fan-out line, such that a number of the gate fan-out lines of a pixel unit can be reduced, a width of a pixel opening area can be increased, and an aperture ratio (AR %) and response time (TR %) of the panel can be improved.

8 Claims, 3 Drawing Sheets

(52) U.S. Cl.
CPC ............. *G09G 2300/0465* (2013.01); *G09G 2310/0267* (2013.01); *G09G 2320/0252* (2013.01)

(56) References Cited

U.S. PATENT DOCUMENTS

| | | | |
|---|---|---|---|
| 2008/0203391 A1* | 8/2008 | Kim | G09G 3/3611 |
| | | | 257/E27.111 |
| 2014/0104155 A1 | 4/2014 | Long et al. | |
| 2015/0115292 A1 | 4/2015 | Jeon et al. | |
| 2016/0240601 A1 | 8/2016 | Kwon et al. | |
| 2017/0053591 A1 | 2/2017 | Seo et al. | |
| 2017/0115543 A1* | 4/2017 | Zou | G02F 1/134336 |
| 2017/0123506 A1 | 5/2017 | Song et al. | |
| 2018/0096663 A1 | 4/2018 | Xu | |
| 2018/0323218 A1 | 11/2018 | Chen | |
| 2019/0280015 A1* | 9/2019 | Chen | G02F 1/133514 |

FOREIGN PATENT DOCUMENTS

| | | |
|---|---|---|
| CN | 103493123 A | 1/2014 |
| CN | 104253147 A | 12/2014 |
| CN | 104267555 A | 1/2015 |
| CN | 104575349 A | 4/2015 |
| CN | 104952883 A | 9/2015 |
| CN | 105372891 A | 3/2016 |
| CN | 105977264 A | 9/2016 |
| CN | 106057820 A | 10/2016 |
| CN | 106200184 A | 12/2016 |
| CN | 206331214 U | 7/2017 |
| CN | 107065376 A | 8/2017 |
| CN | 107632474 A | 1/2018 |
| CN | 207517694 U | 6/2018 |
| CN | 108598142 A | 9/2018 |
| CN | 110047584 A | 7/2019 |
| CN | 111341209 A | 6/2020 |

* cited by examiner

DISPLAY PANEL

FIELD OF INVENTION

The present invention relates to the field of display technology, in particular, to a large-sized mask spliced display panel.

BACKGROUND OF INVENTION

In response to market demands, displays with large size and high resolution as well as ultra-narrow borders (UNB) have become trends of the market, and a requirement of spliced screens is inevitable for narrow borders. The spliced screens require splicing seams to be as small as possible, with less than 1 mm being a future trend. As the resolution becomes higher, a pixel size becomes smaller, and a gate line is designed to be on a horizontal side, such that a space required becomes larger. How to realize narrow border has become a problem to be overcome.

FIG. 1 is a schematic diagram of a gate on array (GOA) panel, wherein the GOAs are distributed on left and right sides of the panel. A periphery of a display area is composed of three parts, namely GOA circuits, GOA buses and common electrodes (COM). Corresponding to large-size, high-resolution products and heavy contact resistance loading (RC loading), the GOA bus is designed with a larger peripheral area. As shown in FIG. 2 and FIG. 3, the gates are designed on a chip on film (COF) side of a circuit board, so that a border of the panel away from the COF side can be greatly reduced. Thus, a border distance can be less than 1 mm, thereby realizing three-edge seamless splicing.

As shown in FIG. 2, since GOA driving units need to be designed on the COF side of the circuit board, a panel with a size of 65 inches or more needs to be completed by splicing a plurality of mask plates, and all GOA designs need to be completed in mask repeating units (for example, in general, a panel with a size of 65 inches has 4524 sub-pixels, and an ultra-high definition (UD) is level 2160), while a number of repetitions of the GOA driving units is n (4524/2160≈2). As shown in FIG. 3, gate fan-out lines are directly connected to the COF side, and the number of repetitions n is selected as 3.

Technical Problems

As shown in FIG. 4, in a standard definition (STD) pixel design, a gate fan-out line (diagonal line-filled patterns provided vertically in FIG. 4) is routed on a side of a data line (dot-filled patterns provided vertically in FIG. 4) of each sub-pixel, so that an output signal of the GOA needs to be connected to a gate of a thin film transistor (unfilled patterns provided horizontally in FIG. 4). Since the gate fan-out lines and the gates are not provided in a same metal layer, the plurality of gate fan-out lines may affect an aperture ratio (AR %) and response time (TR %) of the panel.

Technical Solutions

The object of the present invention is to provide a display panel that changes the layout and reduces the number of the gate fan-out lines, so as to improve the aperture ratio and response time of pixels.

In order to achieve the above object, the present invention provides a display panel, comprising: a substrate; a plurality of gate lines provided laterally on the substrate; and a plurality of gate fan-out lines provided longitudinally on the substrate and insulated from the gate lines, wherein a sub-pixel unit is formed in each of regions where the gate lines intersect the gate fan-out lines, and the sub-pixel unit comprises at least two sub-pixels, and each of the gate fan-out lines is connected with one of the gate lines by a via hole.

Further, the sub-pixel unit is connected with a GOA driving unit by one of the gate fan-out lines, and the GOA driving unit is connected to a bus line.

Further, each of the sub-pixel units further comprises at least two data lines in a one-to-one correspondence with the sub-pixels.

Further, the display panel further comprises: a pixel driving line provided in a layer same as the gate fan-out lines, the pixel driving line, the gate lines, and the gate fan-out lines are covered by an insulating layer.

Further, the display panel further comprises: RGB color resists provided on the insulating layer; a passivation layer provided on the RGB color resists; a pixel electrode provided on the passivation layer and connected with the pixel driving line; a black matrix provided on the pixel electrode; and a cover plate provided on the black matrix.

Further, the insulating layer comprises a first insulating layer and a second insulating layer, the second insulating layer is provided on the first insulating layer; the gate lines are provided in the first insulating layer; and the pixel driving line and the gate fan-out lines are provided in the second insulating layer.

Further, the via hole is formed in the first insulating layer and extends down to a surface of the gate lines.

Further, the passivation layer is provided with a through hole, the through hole extends down to a surface of the pixel driving line, and the pixel electrode is connected with the pixel driving line by the through hole.

Further, each of the gate lines corresponds to at least one via hole.

Further, the sub-pixel units are connected with a Chip on Film by the gate fan-out lines.

Beneficial Effects

The beneficial effects of the present invention are that, the present invention provides a display panel, and by means of using a plurality of sub-pixels as a sub-pixel unit, each of the sub-pixel units corresponds to one gate fan-out line, such that the number of the gate fan-out lines of the pixel unit can be reduced, the width of opening area of the pixel can be increased, and the aperture ratio (AR %) and the response time (TR %) of the panel can be improved.

DESCRIPTION OF DRAWINGS

In order to explain the technical solutions in the embodiments of the present invention more clearly, the following will introduce briefly the drawings used in the description of the embodiments. Obviously, the drawings in the following description are merely several embodiments of the present invention. For those skilled in the art, other drawings can be obtained based on these drawings without creative work.

Figure 1:
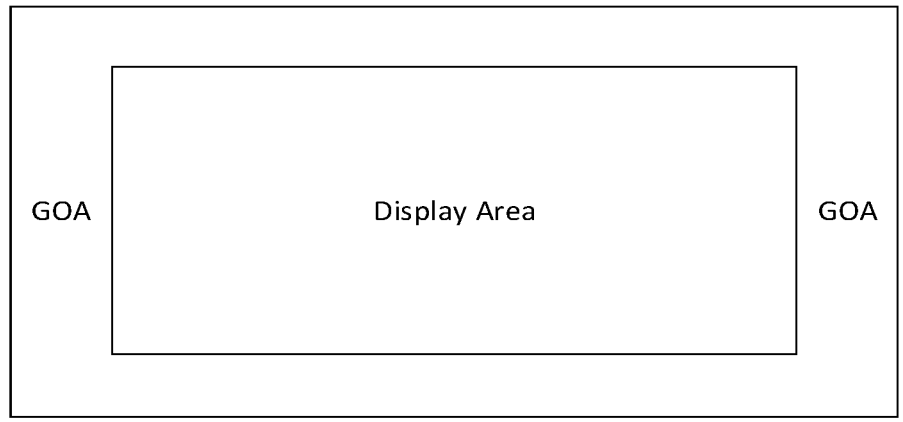
FIG. 1 is a schematic plan view of a display panel in the prior art.

Display panel 100; sub-pixel unit 110; sub-pixel 120; substrate 101; gate line 102; data line 104; gate fan-out line 103; via hole 105; pixel driving line 113; RGB color resist 107; passivation layer 108; pixel electrode 112; black matrix 109; cover plate 111; first insulating layer 1061; second insulating layer 1062.

DETAILED DESCRIPTION OF EMBODIMENTS

The following description of each embodiment refers to the attached drawings to illustrate specific embodiments implemented in the present invention. The directional terms mentioned in the present invention, such as up, down, front, back, left, right, inside, outside, lateral, etc., are merely directions with reference to the drawings. The names of components mentioned in the present invention, such as the first, second, etc., are merely used to distinguish different components and can be expressed in a better way. In the drawings, units with similar structures are indicated by a same reference numeral.

The embodiments of the present invention will be described in detail herein with reference to the accompanying drawings. The present invention can be embodied in many different forms, and the present invention should not be construed as the specific embodiments set forth herein. The embodiments of the present invention are provided to explain the practical application of the present invention, so that those skilled in the art can understand various embodiments of the present invention and various modifications suitable for specific expected applications.

Figure 5:
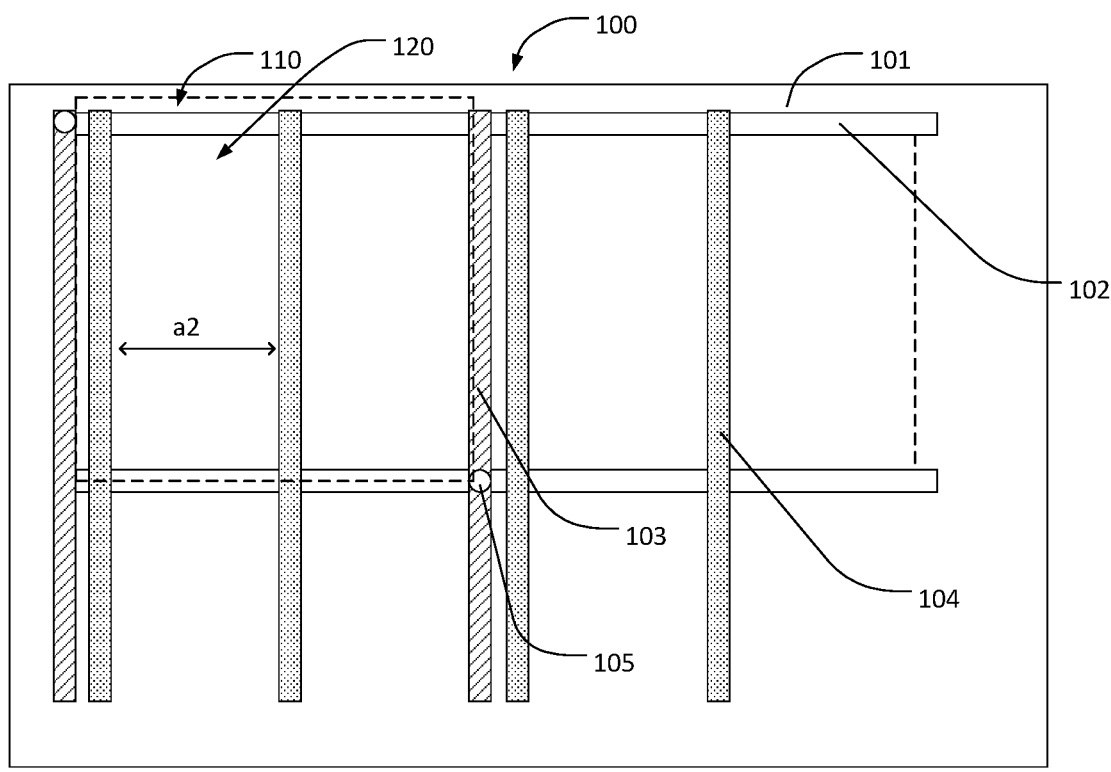
FIG. 5 is a schematic plan view of a layout of a display panel provided by the present invention.
Figure 6:
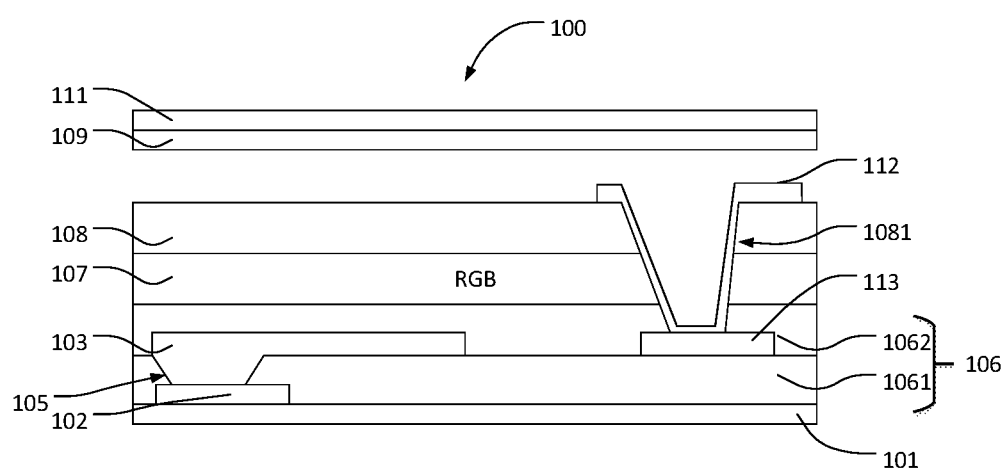
FIG. 6 is a horizontal cross-sectional view of FIG. 5 at a via hole.

Referring to FIG. 5 and FIG. 6 at the same time, the present invention provides a display panel 100, comprising: a substrate 101, a plurality of gate lines 102, a data line 104, and a plurality of gate fan-out lines 103.

The gate lines 102 are provided laterally on the substrate 101, and each of the gate lines 102 is parallel to each other.

The gate fan-out lines 103 are provided longitudinally on the substrate 101 and insulated from the gate lines 102, and each of the gate fan-out lines 103 is parallel to each other. The gate fan-out lines 103 and the gate lines 102 are provided in an insulating layer 106.

A sub-pixel unit 110 is formed in each region where the gate lines 102 intersect the gate fan-out lines 103.

The sub-pixel unit 110 comprises at least two sub-pixels 120, and each of the gate fan-out lines 103 is connected with one of the gate lines 102 by a via hole 105.

Each of the gate lines 102 corresponds to at least one via hole 105.

Figure 2:
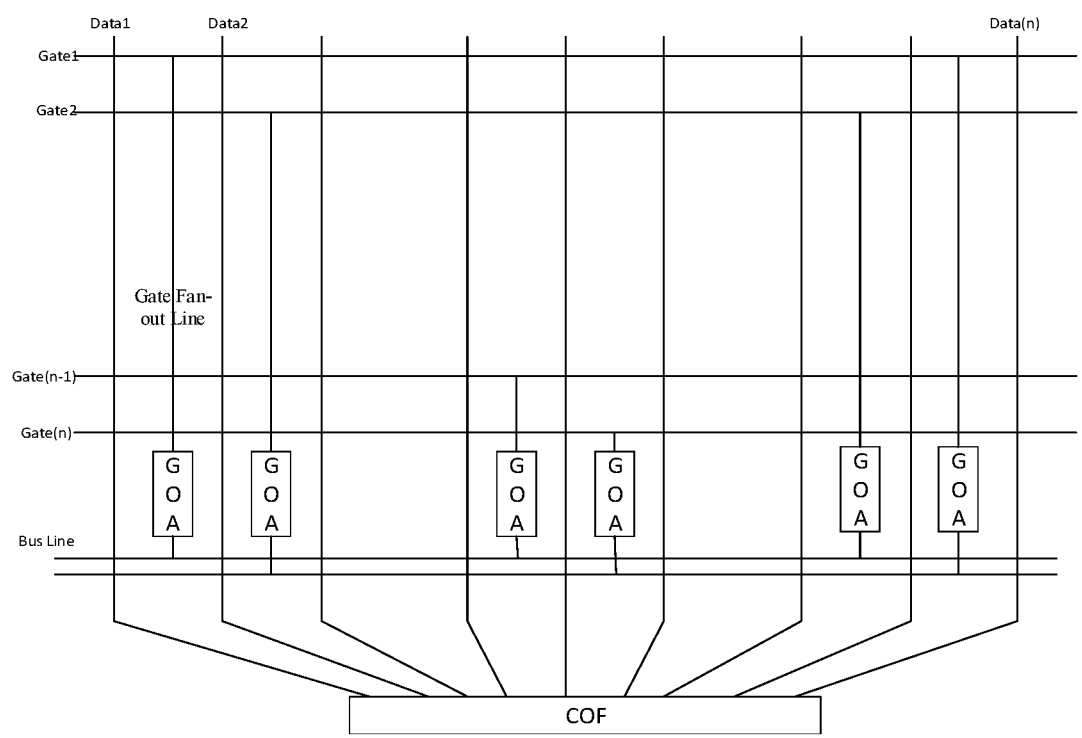
FIG. 2 is a schematic plan view of a layout of the display panel in the prior art.
Figure 3:
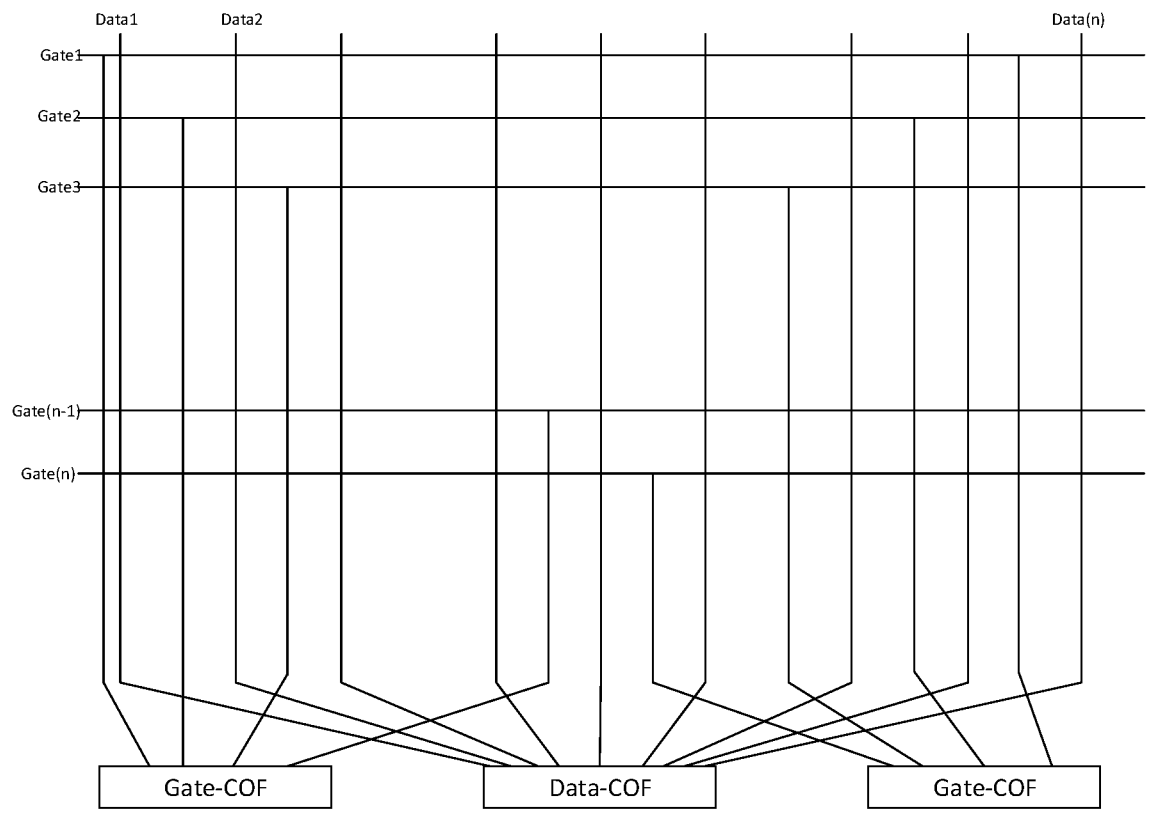
FIG. 3 is another schematic plan view of the layout of the display panel in the prior art.

The sub-pixel unit 110 is connected with a GOA driving unit by one of the gate fan-out lines 103, and the GOA driving unit is connected to a GOA bus line (as shown in FIG. 2). In other embodiments, the gate fan-out lines 103 can be connected directly to a gate-COF (as shown in FIG. 3).

That is, the present invention uses a plurality of sub-pixels 120 as a sub-pixel unit 110, each of the sub-pixel units 110 corresponds to one gate fan-out line 103, such that the number of the gate fan-out lines 103 of a pixel unit can be reduced, the width of opening area of a pixel can be increased, and the aperture ratio (AR %) and the response time (TR %) of the panel can be improved.

In a sub-pixel unit 110, each of the sub-pixels 120 corresponds to one data line 104. In the present embodiment, there is at least two data lines 104, and the data lines 104 are connected to the chip on film (COF, as shown in FIG. 2) on one side of the panel. In other embodiments, the data line 104 can be connected to the data-COF of a panel (as shown in FIG. 3).

Figure 4:
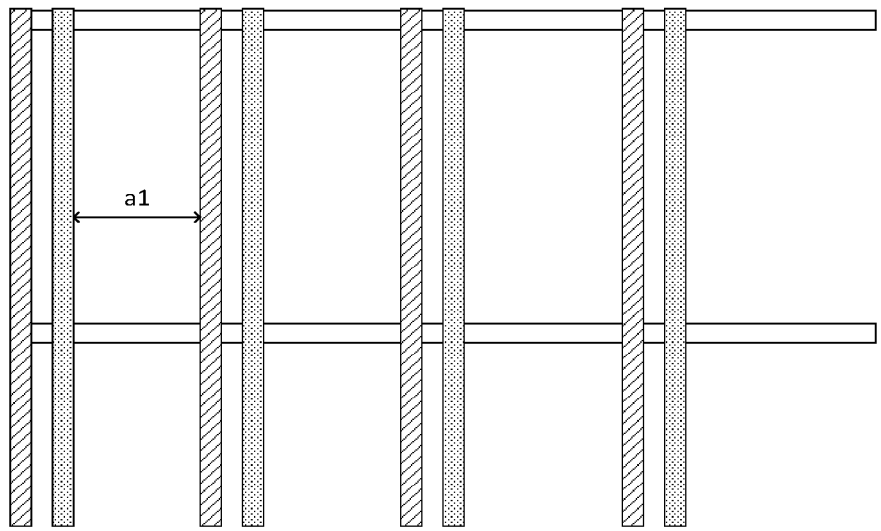
FIG. 4 is yet another schematic plan view of the layout of the display panel in the prior art.

The width of the sub-pixel 120 of the present invention is a2, and the width in the prior art as shown in FIG. 4 is a1, thus compared with the prior art, the increased width of the present invention is n, and n is the number of sub-pixels 120 in one sub-pixel unit 110.

The display panel 100 further comprises: a pixel driving line 113, RGB color resists 107, a passivation layer 108, a pixel electrode 112, a black matrix 109, and a cover plate 111.

The pixel driving line 113 and the gate fan-out lines 103 are provided in a same layer, and the pixel driving line 113, the gate lines 102, and the gate fan-out lines 103 are covered by the insulating layer 106.

The insulating layer 106 comprises a first insulating layer 1061 and a second insulating layer 1062, and the second insulating layer 1062 is provided on the first insulating layer 1061.

The via holes 105 are formed in the first insulating layer 1061 and extends down to a surface of the gate lines 102.

The gate lines 102 are provided in the first insulating layer 1061, and the pixel driving line 113 and the gate fan-out lines 103 are provided in the second insulating layer 1062.

The RGB color resists 107 are provided on the insulating layer 106.

The passivation layer 108 is provided on the RGB color resists 107. The passivation layer 108 is provided with a through hole, and the through hole extends down to a surface of the pixel driving line 113.

The pixel electrode 112 is provided on the passivation layer 108 and connected to the pixel driving line 113, and the pixel electrode 112 is connected to the pixel driving line 113 by the through hole.

The black matrix 109 is provided on the pixel electrode 112. The cover plate 111 is provided on the black matrix 109.

Compared with the prior art, the present invention merely adds the steps of setting a mask and etching the first insulating layer 1061 by the mask to form the via holes 105 during preparation.

The technical scope of the present invention is not limited merely to the contents in the description. Those skilled in the art can make various variations and modifications to the embodiments without departing from the technical ideas of the present invention, and these variations and modifications shall be fallen within the scope of the present invention.

What is claimed is:

1. A display panel, comprising:
    a substrate;
    a plurality of gate lines disposed laterally on the substrate;
    a plurality of gate fan-out lines arranged longitudinally on the substrate and insulated from the gate lines;
    a pixel driving line disposed in a layer same as the gate fan-out lines, wherein the pixel driving line, the gate lines, and the gate fan-out lines are covered by an insulating layer;
    RGB color resists disposed on the insulating layer;
    a passivation layer disposed on the RGB color resists;
    a pixel electrode disposed on the passivation layer and connected to the pixel driving line;
    a black matrix disposed on the pixel electrode; and
    a cover plate disposed on the black matrix;
    wherein a sub-pixel unit is formed in each of regions divided by the gate lines intersecting the gate fan-out lines, each of the sub-pixel units comprises at least two sub-pixels, and each of the gate fan-out lines is connected with one of the gate lines through a via hole.

2. The display panel as claimed in claim 1, wherein the sub-pixel unit is connected with a GOA driving unit by one of the gate fan-out lines, and the GOA driving unit is connected to a bus line.

3. The display panel as claimed in claim 2, wherein the sub-pixel units are connected with a chip on film by the gate fan-out lines.

4. The display panel as claimed in claim 1, wherein each of the sub-pixel units further comprises at least two data lines disposed in a one-to-one correspondence with the sub-pixels.

5. The display panel as claimed in claim 1, wherein
the insulating layer comprises a first insulating layer and a second insulating layer, and the second insulating layer is disposed on the first insulating layer;
the gate lines are disposed in the first insulating layer; and
the pixel driving line and the gate fan-out lines are disposed in the second insulating layer.

6. The display panel as claimed in claim 5, wherein the via hole is defined in the first insulating layer and extends down to a surface of the gate lines.

7. The display panel as claimed in claim 1, wherein the passivation layer is provided with a through hole, the through hole extends down to a surface of the pixel driving line, and the pixel electrode is connected to the pixel driving line through the through hole.

8. The display panel as claimed in claim 1, wherein each of the gate lines is arranged corresponding to at least one via hole.

\* \* \* \* \*